United States Patent [19]
Bouayad-Amine et al.

[11] Patent Number: 5,248,635
[45] Date of Patent: Sep. 28, 1993

[54] METHOD OF FABRICATING AND PASSIVATING SEMICONDUCTOR DEVICES

[75] Inventors: Jamal Bouayad-Amine, Ludwigsburg; Wolfgang Kuebart, Stuttgart; Joachim Scherb, Esslingen-Zell, all of Fed. Rep. of Germany

[73] Assignee: Alcatel N.V., Amsterdam, Netherlands

[21] Appl. No.: 707,047

[22] Filed: May 29, 1991

[30] Foreign Application Priority Data

Jun. 2, 1990 [DE] Fed. Rep. of Germany ....... 4017870

[51] Int. Cl.$^5$ .......................................... H01L 21/465
[52] U.S. Cl. ......................................... 437/228; 437/5; 437/154; 437/946; 437/987; 156/643; 156/657; 257/631; 257/632
[58] Field of Search ................... 437/228, 5, 946, 238, 437/116, 154; 156/643; 148/DIG. 18, DIG. 56; 257/631, 626, 56, 58, 62

[56] References Cited

U.S. PATENT DOCUMENTS

| | | | |
|---|---|---|---|
| 3,969,164 | 7/1976 | Cho et al. | 437/237 |
| 4,246,296 | 1/1981 | Chang et al. | 437/17 |
| 4,830,705 | 5/1989 | Loewenstein et al. | 156/643 |
| 4,987,008 | 1/1991 | Yamazaki et al. | 437/228 |
| 5,098,851 | 3/1992 | Ito et al. | 437/5 |

FOREIGN PATENT DOCUMENTS

0128724 12/1984 European Pat. Off. .

OTHER PUBLICATIONS

Bowser et al, "The effect of PECVD $Si_3N_4$ deposition and plasma pretreatmetns on the surface electronic properties of n–GaAs and SI–GaAs", Gallium Arsenide and Related Compounds 1988 Proceedings of the 15th International Symposium on Gallium Arsenide and Related Compounds, Sep. 11th, 1988, pp. 405–408.

Peyre et al; "Passivation des Photodiodes a avalanche InP/InGaAs a structure planaire par depot de nitrure de silicium PECVD", Vide, Les Couches Minces, Bd. 45, Nr. 251, Mar. 1990, Paris FR pp. 80–81.

Nguyen et al, "Passivation de transistors a jonction sur GaInAs par depot de nitrure de silicium en PEVCD", Vide, Les Couches Minces, Bd. 43, Nr. 241, Mar. 1988, Paris FR pp. 229–230.

Faith et al, "Comparative Investigation of CF4–Plasma, Ar–Plasma, and Dilute–HF–Dip Cleaning, Method for (Al–Si)/n + $S_i$ Contacts", Journal of the Electrochemical Society, Bd 34 (1987) Mar., No. 3, Manchester, New Hampshire, USA.

P. Boher et al. "In GaAs/$Si_3N_4$ Interface . . . " Esprit #92.7 (date unknown).

M. Tailepied et al. "Current Drift Mechanism . . . " Appl. Phys. Lett. 48 (15) Apr. 14, 1986.

Primary Examiner—Robert Kunemund
Assistant Examiner—H. Jey Tsai
Attorney, Agent, or Firm—Spencer, Frank & Schneider

[57] ABSTRACT

In a method of forming and passivating device regions in III-V semiconductor substrates, a substrate surface is pretreated in a halogen-carbon plasma prior to depositing of insulating or passivating layers. Devices produced by pretreating the substrate surface have considerably better electrical values than devices fabricated without this pretreatment. In particular, devices fabricated with this pretreatment have a low reverse current (dark current).

14 Claims, 3 Drawing Sheets

METHOD OF FABRICATING AND PASSIVATING SEMICONDUCTOR DEVICES

BACKGROUND OF THE INVENTION

The present invention relates to a method for fabricating and passivating semiconductor devices and in particular for fabricating passivating layers on semiconductor devices yielding improved electrical properties.

It has been known for a fairly long time that in the case of III-V compound semiconductors a native oxide layer forming on the semiconductor surface during the fabrication process is the reason why the electrical properties of devices made from such semiconductors are not as good as they should be in theory or as is desirable.

For example, as stated in an article by M. Taillepied and S. Goussier in "Appl. Phys. Lett." 48 (15), 1986, pages 978 to 980, the drain current of field-effect transistors fabricated from III-V compound-semiconductor material is not stable. Also, in photodiodes fabricated from such semiconductor material, too high a dark current is measured, which results in an undesirable noise source in optoelectronic applications. Reduction of this dark current is the subject matter of the published European Patent Application 128 724.

Various authors have proposed methods for suppressing the undesired effect of the native oxide layer during the fabrication of III-V compound-semiconductor devices. This is usually done by preventing or at least reducing the formation of the native oxide layer or by selectively removing the native oxide layer prior to the deposition of an insulating or passivating layer.

In a paper by P. Boher et al from the INFOS 1987 conference at Leuven, Mar. 12 through 14, 1987, and subsequently also appeared in print and comes closest to the present invention, the removal of the native oxide layer using a hydrogen plasma is described. However, even though the substrate surface is coated with silicon nitride ($Si_3N_4$) immediately after removal of the native oxide layer, formation of a thinner native oxide layer prior to the coating with $Si_3N_4$ cannot be prevented.

The last-mentioned method, as expected, results in an improvement in the electrical values of the semiconductor devices, but this improvement still appears to be insufficient.

SUMMARY OF THE INVENTION

It is an object of the invention to provide a method whereby the diffusion-masking and passivating layers needed to fabricate the semiconductor devices can be deposited without affecting the semiconductor surface, that is, in a manner which degrades the electrical properties of the devices.

The above and other objects, advantages and features are accomplished in accordance with the invention by the provision of a method of forming and passivating device regions on a compound-semiconductor substrate after deposition and photolithographic patterning of a diffusion-masking layer, impurity atoms are diffused to form doped regions whose interfaces to the substrate form pn junctions, and wherein prior to the deposition of the diffusion-masking layer or a passivating layer, the substrate surface is pretreated by exposing it to a plasma. The plasma is excited in an atmosphere containing at least one halogen-carbon compound.

The pretreatment of the semiconductor surface by means of a halogen-carbon compound under the action of a plasma results in a considerable reduction of the reverse pn-junction currents. For example, pin diodes with surfaces pretreated in accordance with the invention have very low dark currents. Edge breakdowns in avalanche photodiodes (APDs) due to surface degradation no longer occur.

Unlike the prior art, however, these advantages are attributable not to a removal of the native oxide layer—which is essentially preserved—, but to the formation of a thin layer (possibly a polymer layer) which protects the semiconductor and its native oxide layer during the subsequent deposition of layers against direct action of the plasma.

In a preferred embodiment of the method according to the invention, $CF_4$ is used as the halogen-carbon compound. This compound has produced good results and has the advantage of containing the same halogen as many hydrofluoric-acid-containing etchants used for surface pretreatment.

Further embodiments of the invention relate to the production of the plasma—preferably, an ordinary parallel-plate reactor is employed, and to semiconductor-insulating-layer combinations especially suited for use in the method according to the invention.

DETAILED DESCRIPTION OF THE PREFERRED EMBODIMENTS

The method according to the invention will now be described in detail with reference to the figures.

Figure 1A:
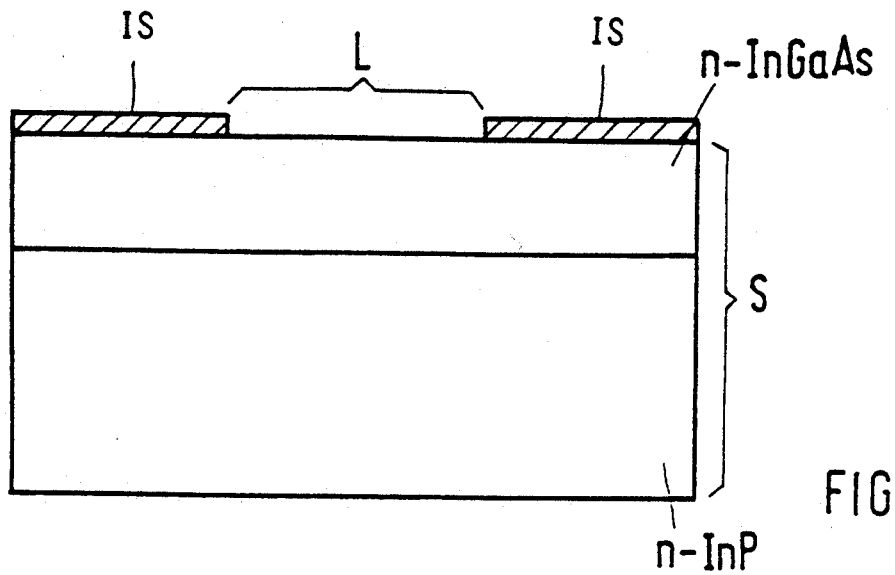
FIGS. 1A–1C show a conventional planar InGaAs-InP pin photodiode in different phases of its fabrication.
Figure 1B:
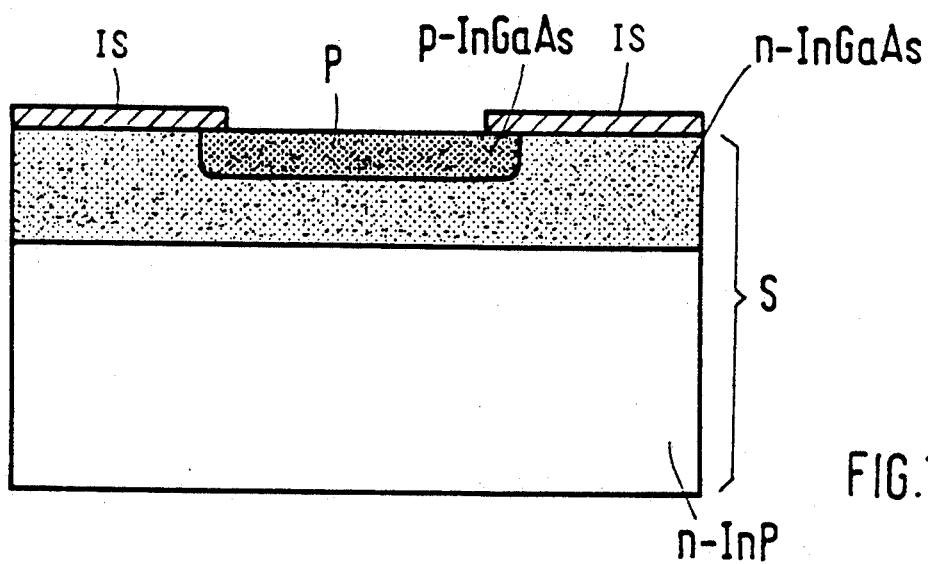
Figure 1C:
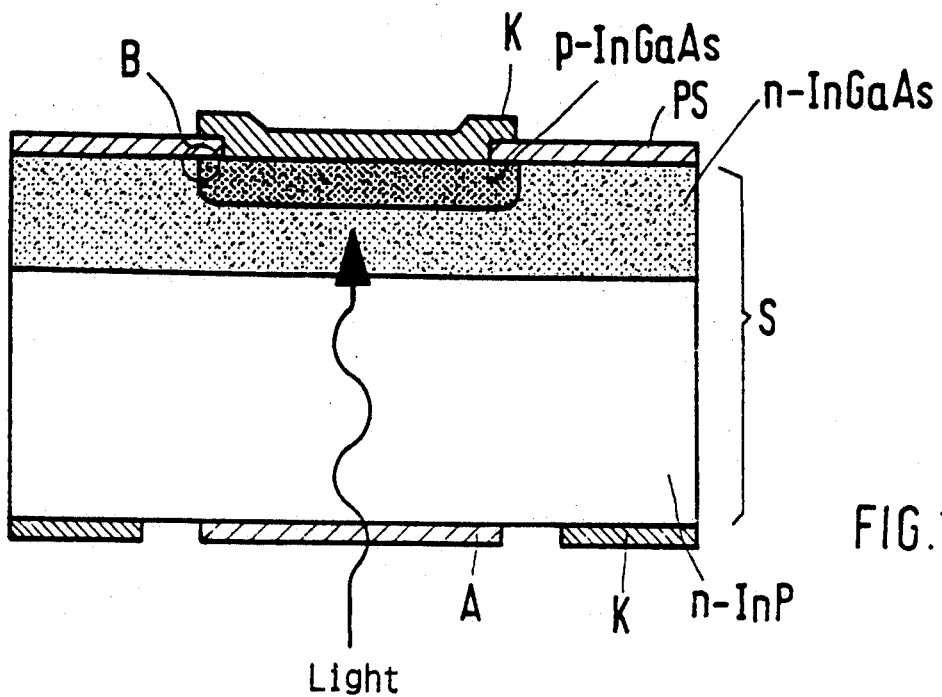

FIGS. 1A–1C show a conventional planar InGaAs-InP pin photodiode in different phases of its fabrication.

FIG. 1A shows a two-layer substrate S of n-type indium phosphide (InP) and n-type indium gallium arsenide (InGaAs) deposited on the indium phosphide. Since Zn or Cd, for example, is to be diffused into this substrate S to form a p-type region, the substrate is covered with an insulating layer IS of $SiO_x$, $SiN_y$ or $SiO_xN_y$ in which an opening L of predetermined shape and area was formed by photolithographic techniques to define this region. The insulating layer thus represents a diffusion mask.

FIG. 1B shows the substrate S with the p-type region P formed by diffusion and a pn junction between the p-type region P and the n-type substrate.

FIG. 1C shows the finished pin photodiode with deposited metal contacts K, an antireflective layer A on a light entrance surface, and a passivating layer PS which, after removal of the diffusion mask, covers the n-type and p-type regions on the top side of the substrate.

The device shown in FIGS. 1A to 1C in different stages of fabrication can be produced in various ways. The individual semiconductor and insulating layers can be deposited, for example, by sputtering or chemical vapor deposition (CVD). The latter process has become known as thermal CVD, plasma-enhanced CVD (PECVD), or photon-assisted CVD, depending on whether the chemical reaction is initiated by heat, a plasma, or short-wavelength light.

The conventionally fabricated device of FIGS. 1A to 1C has insufficient electrical properties, particularly, too high a reverse current (dark current). In various investigations, which will not be dealth with here, the cause of this insufficiency was found to be damage to the semiconductor surface in the area of the pn junction (area B in FIG. 1C). This damage is obviously caused by the action of a native oxide layer present on the semiconductor surface during the deposition of diffusion-masking or passivating layers.

In the method according to the invention, a plasma-enhanced CVD process, differs from conventional methods of this kind in that prior to the deposition of an insulating layer serving as a diffusion mask or of a passivating layer, the surface to be coated is pretreated in a halogen-carbon plasma. To this end, the substrate surface to be coated, after being cleaned with buffered hydrofluoric acid, is placed in a commercially available PECVD parallel-plate reactor and heated to a temperature of about 200° C. Thereafter, a $CF_4$ atmosphere with a pressure of 0.8 mb is produced in the reactor via inlet and outlet connections, and a plasma is produced by applying an RF voltage to the electrode plates of the reactor.

After the semiconductor surface has been exposed to the $CF_4$ plasma for about 1 minute, the $CF_4$ is replaced by other reaction gasses (e.g., $SiH_4$, $N_2O$, $N_2$) needed to build up the insulating or passivating layer, and the substrate is coated for about 6 to 7 minutes. The layer formed may be of $SiO_2$, $Si_3N_4$ or $SiO_xN_y$, depending on the composition of the reaction gasses.

Figure 2:
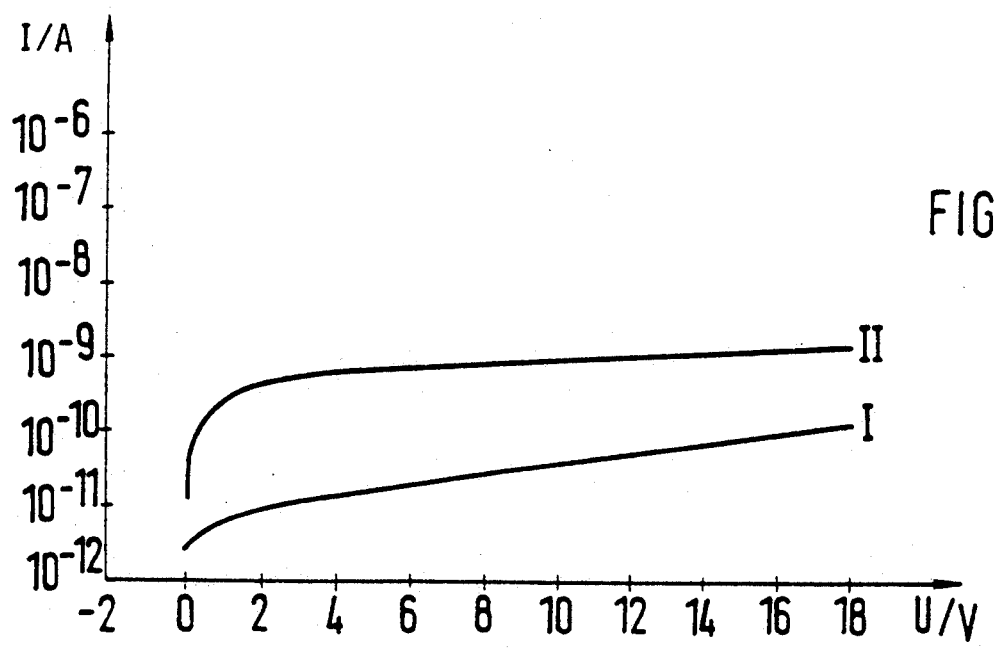
FIG. 2 is a graph of dark-current characteristics of planar pin photodiodes fabricated on InGaAs (II) and on InP (I).

The electrical values of a photodiode fabricated by this method are greatly improved in comparison with those of such devices made by conventional methods. FIG. 2 is a graph of dark-current characteristics of planar pin photodiodes fabricated on InGaAs (II) and on InP (I) by the method described in the foregoing.

As these characteristics show, the method described is suitable for preventing damage to the semiconductor surface during the deposition of insulating or passivating layers on both InGaAs and InP substrates. This permits the fabrication of devices with good and stable electrical values.

Figure 3:
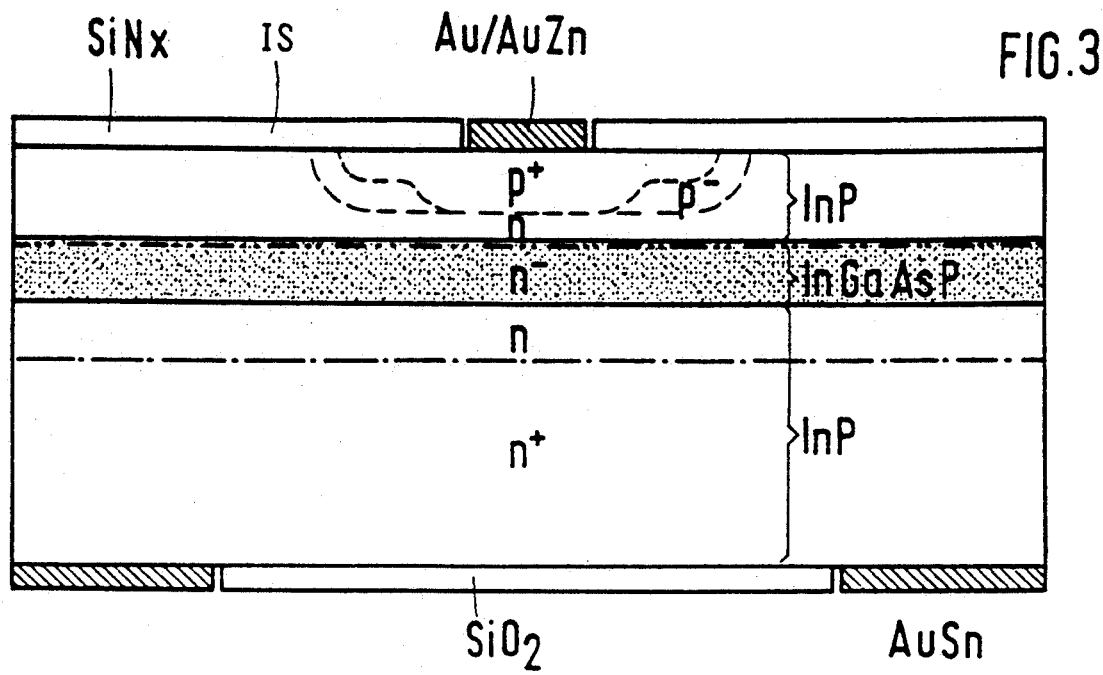
FIG. 3 shows a planar double heterojunction on which a passivating layer IS of $SiN_x$ can be deposited.
Figure 4:
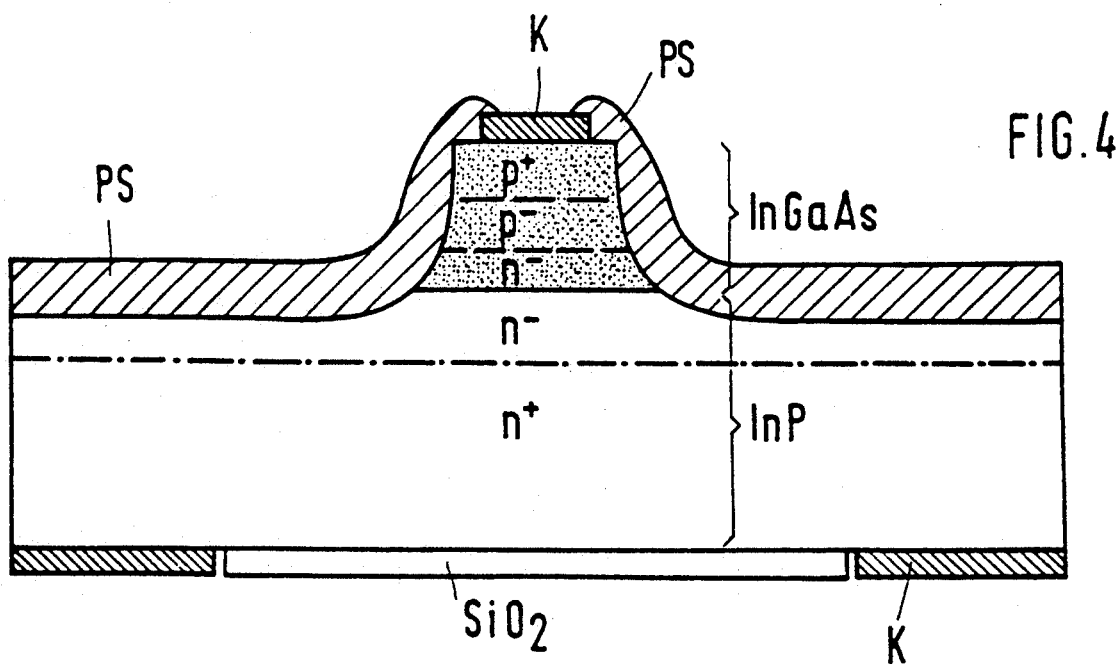
FIG. 4 shows a mesa pin diode with a passivating layer.

The method described is not limited to pin photodiodes and planar devices. FIG. 3 shows schematically the structure of a planar double-heterojunction APD (avalanche photodiode) on which the passivating layer IS of $SiN_x$ can be deposited after the substrate surface has been pretreated by the method described. FIG. 4 shows a mesa pin diode with a passivating layer PS deposited by the method described. The Letters n and p indicate the polarities of the dopants in the semiconductor regions designated by the chemical compositions of their materials, and the superscript signs + or − indicate the doping level (+ =heavy, − =weak, no sign=-normal).

We claim:

1. In a method of forming a compound-semiconductor device having a pn junction which extends to a surface of a semiconductor substrate, said method including forming a passivating layer on said semiconductor substrate surface; the improvement wherein said step of forming a passivating layer comprises the sequential steps consisting essentially of:

exposing said substrate surface to a plasma excited in an atmosphere containing at least a halogen-carbon compound thereby yielding a pretreated substrate surface; and then depositing a passivating layer on the pretreated substrate surface.

2. A method as claimed in claim 1, wherein said exposing step comprises exposing the substrate surface to a plasma excited in an atmosphere of tetrafluorocarbon.

3. A method as claimed in claim 1, wherein said semiconductor substrate is made of one of indium phosphide, indium gallium arsenide, indium gallium arsenide phosphide, indium aluminum arsenide, and indium gallium aluminum arsenide.

4. The method as claimed in claim 1, wherein said exposing step includes exposing the substrate surface to the plasma using a PECVD parallel-plate reactor, and said depositing step includes depositing, in direct succession to said exposing step, the passivating layer on the pretreated substrate surface using the PECVD parallel-plate reactor.

5. The method as claimed in claim 1, wherein said exposing step includes exposing the substrate surface to the plasma for approximately 1 minute.

6. The method as claimed in claim 1 further comprising the stop heating the semiconductor substrate to approximately 200 degrees C. prior to said step of exposing.

7. The method as claimed in claim 1, wherein said depositing step includes depositing a passivating layer comprising at least one of silicon dioxide, silicon nitride, and silicon oxynitride.

8. The method as claimed in claim 3, wherein said depositing step includes depositing a passivating layer comprising at least one of silicon dioxide, silicon nitride, and silicon oxynitride.

9. The method as claimed in claim 1, wherein said passivating layer is a diffusing masking layer and said method further comprises the steps of:

opening a window in said masking layer to expose said substrate surface; and diffusing impurity atoms into said surface via said window to form said pn-junction.

10. A method of forming and passivating device regions of a compound-semiconductor substrate comprising the steps of:

providing a substrate of a compound-semiconductor material;

exposing a surface of the compound-semiconductor substrate to a plasma excited in an atmosphere containing at least a halogen-carbon compound, yielding a pretreated substrate surface;

then depositing a diffusion masking layer on the pretreated substrate surface;

opening a window in the masking layer to expose a portion of the compound-semiconductor substrate; and diffusing impurity atoms into said surface of the compound-semiconductor substrate via said window to form a pn junction which extends to said substrate surface beneath said masking layer.

11. The method as claimed in claim 10, wherein said providing step includes providing a semiconductor substrate made of one of indium phosphide, indium gallium arsenide, indium gallium arsenide phosphide, indium aluminum arsenide, and indium gallium aluminum arsenide.

12. The method as claimed in claim 11, wherein said depositing step includes depositing a diffusion masking layer comprising at least one of silicon dioxide, silicon nitride, or silicon oxynitride.

13. The method as claimed in claim 10, wherein said exposing step includes exposing the substrate surface to the plasma using a PECVD parallel-plate reactor, and said depositing step includes depositing, in direct succession to said exposing step, the diffusion masking layer on the pretreated substrate surface using the PECVD parallel-plate reactor.

14. The method as claimed in claim 10, wherein said exposing step comprises exposing the substrate surface to a plasma excited in an atmosphere of tetrafluorocarbon.

* * * * *